United States Patent
Bae et al.

(10) Patent No.: US 8,171,273 B2
(45) Date of Patent: May 1, 2012

(54) METHOD AND APPARATUS FOR RECONFIGURING SOFTWARE IN SDR TERMINAL

(75) Inventors: Hyung-deug Bae, Daejeon-si (KR); Nam-hoon Park, Daejeon-si (KR)

(73) Assignee: Electronics and Telecommunications Research Institute, Daejeon-si (KR)

( * ) Notice: Subject to any disclaimer, the term of this patent is extended or adjusted under 35 U.S.C. 154(b) by 422 days.

(21) Appl. No.: 12/552,192

(22) Filed: Sep. 1, 2009

(65) Prior Publication Data
US 2010/0125727 A1 May 20, 2010

(30) Foreign Application Priority Data
Nov. 18, 2008 (KR) .................. 10-2008-0114509

(51) Int. Cl.
*G06F 9/00* (2006.01)
*G06F 9/24* (2006.01)
*G06F 15/177* (2006.01)
*G06F 9/44* (2006.01)
*G06F 9/445* (2006.01)

(52) U.S. Cl. ............ 713/1; 713/2; 713/100; 717/168; 717/172; 717/173; 717/174; 717/177; 717/178

(58) Field of Classification Search .............. None
See application file for complete search history.

(56) References Cited

U.S. PATENT DOCUMENTS

| | | | |
|---|---|---|---|
| 5,805,898 A * | 9/1998 | Barsness et al. ............ 717/175 |
| 6,865,387 B2 * | 3/2005 | Bucknell et al. ............ 455/418 |
| 7,240,320 B1 * | 7/2007 | Trimberger et al. ......... 716/117 |
| 7,512,940 B2 * | 3/2009 | Horvitz ...................... 717/173 |
| 7,926,053 B1 * | 4/2011 | Rowe et al. ................ 717/175 |
| 2005/0102665 A1 * | 5/2005 | Barta et al. ................ 717/174 |
| 2006/0015674 A1 | 1/2006 | Murotake |
| 2006/0130043 A1 * | 6/2006 | Park et al. .................. 717/168 |
| 2006/0154691 A1 | 7/2006 | Tang et al. |
| 2006/0155827 A1 * | 7/2006 | Prehofer et al. ............. 709/220 |
| 2009/0113558 A1 * | 4/2009 | Prabhakaran et al. ........ 726/27 |

FOREIGN PATENT DOCUMENTS
KR 1020020025472 A 4/2002

* cited by examiner

*Primary Examiner* — Ji H Bae
(74) *Attorney, Agent, or Firm* — Kile Park Goekjian Reed & McManus PLLC

(57) ABSTRACT

A method and apparatus for reconfiguring software in a software-based wireless terminal when a new wireless communication service is to be carried out is provided. The method of reconfiguring software at a software defined radio (SDR) terminal including one or more reconfigurable elements, includes: indentifying program installation time and program startup time with respect to the respective reconfigurable elements, selecting a reconfigurable element from the one or more reconfigurable elements based on the program installation time and the program startup time, and placing a program on the selected reconfigurable element. Accordingly, time for installing a new wireless communication service can be reduced in the SDR mobile communication terminal. Thus, convenience can be provided to a user.

17 Claims, 4 Drawing Sheets

METHOD AND APPARATUS FOR RECONFIGURING SOFTWARE IN SDR TERMINAL

CROSS REFERENCE TO RELATED APPLICATION

This application claims the benefit under 35 U.S.C. §119(a) of Korean Patent Application 10-2008-114509, filed on Nov. 18, 2008, the disclosure of which is incorporated herein in its entirety by reference.

BACKGROUND

1. Field

The following description relates to a software based wireless terminal, and more particularly, to a method and apparatus for reconfiguring software in enabling a new wireless communication service in a software-defined radio (SDR) terminal.

2. Description of the Related Art

Most existing multi-mode wireless communication devices are configured with application-specific integrated circuit (ASIC) devices which are implemented according to different wireless communication standards.

However, this conventional arrangement has disadvantages as the devices are large in size, have high power consumption and low adaptability. As an alternative to this conventional arrangement, software-defined radio (SDR) devices have been introduced.

SDR technology allows various types of wireless communication services employing different devices to be integrated with one another by only changing the software of the devices. That is, SDR devices use pieces of reconfigurable hardware so that the reconfigurable hardware can function as wireless communication devices with different functionalities. For example, an SDR transmission/receipt apparatus may be configured to function as a high speed downlink packet access (HSDPA) apparatus by installation of a first given piece of software, and function as a mobile WiMAX apparatus by installation of a second given piece of software.

To this end, an SDR apparatus includes reconfigurable elements such as a general purpose microprocessor (GPP), a digital signal processor (DSP) and a field programmable gate array (FPGA). The wireless communication apparatus is programmed to function as a particular wireless communication apparatus by placing and installing programs on the reconfigurable elements and then by starting the programs. However, even for the SDR apparatus, it takes significant time to allocate and install programs on the reconfigurable elements.

For example, an SDR terminal apparatus including reconfigurable elements such as GPP, DSP and FPGA takes several tens of seconds to install and initiate an HSDPA program of several megabytes on the reconfigurable element and initiate a service. Therefore, reduction of time for initiating a new wireless communication service on the SDR terminal apparatus is required.

SUMMARY

Accordingly, in one aspect, there are provided a software reconfiguring method and apparatus which can reduce time for initiating a wireless communication service in a software defined radio (SDR) apparatus including at least one reconfigurable element.

According to one aspect, there is provided a method of reconfiguring software at a software defined radio (SDR) terminal including one or more reconfigurable elements, the method including: indentifying program installation time and program startup time with respect to the respective reconfigurable elements, selecting a reconfigurable element from the one or more reconfigurable elements based on the program installation time and the program startup time, and placing a program on the selected reconfigurable element.

In the selecting of one reconfigurable element, a reconfigurable element having the largest sum of the program installation time and the program startup time may be selected.

The method may further include, prior to the selecting of one reconfigurable element, generating an element list including information of the respective reconfigurable elements upon receipt of a request for initiating a new wireless communication service, and deleting the selected reconfigurable element from the element list after the selecting is performed.

The method may further include, after the deleting of the selected reconfigurable element, determining whether or not the element list still includes any other reconfigurable elements, wherein when it is determined that other reconfigurable elements are included in the element list, a reconfigurable element is selected from the other reconfigurable elements.

According to another aspect, there is provided a software reconfiguring apparatus including one or more reconfigurable elements, the programming of each of which being reconfigurable, and a control unit to select a configurable element from the reconfigurable elements based on program installation time and program startup time and to place the program on the selected reconfigurable element.

Other features will become apparent to those skilled in the art from the following detailed description, which, taken in conjunction with the attached drawings, discloses exemplary embodiments of the invention.

BRIEF DESCRIPTION OF THE DRAWINGS

Elements, features, and structures are denoted by the same reference numerals throughout the drawings and the detailed description, and the size and proportions of some elements may be exaggerated in the drawings for clarity and convenience.

DETAILED DESCRIPTION

The following detailed description is provided to assist the reader in gaining a comprehensive understanding of the methods, apparatuses and/or systems described herein. Various changes, modifications, and equivalents of the systems, apparatuses and/or methods described herein will suggest themselves those of ordinary skill in the art. Descriptions of well-known functions and structures are omitted to enhance clarity and conciseness.

Figure 1:
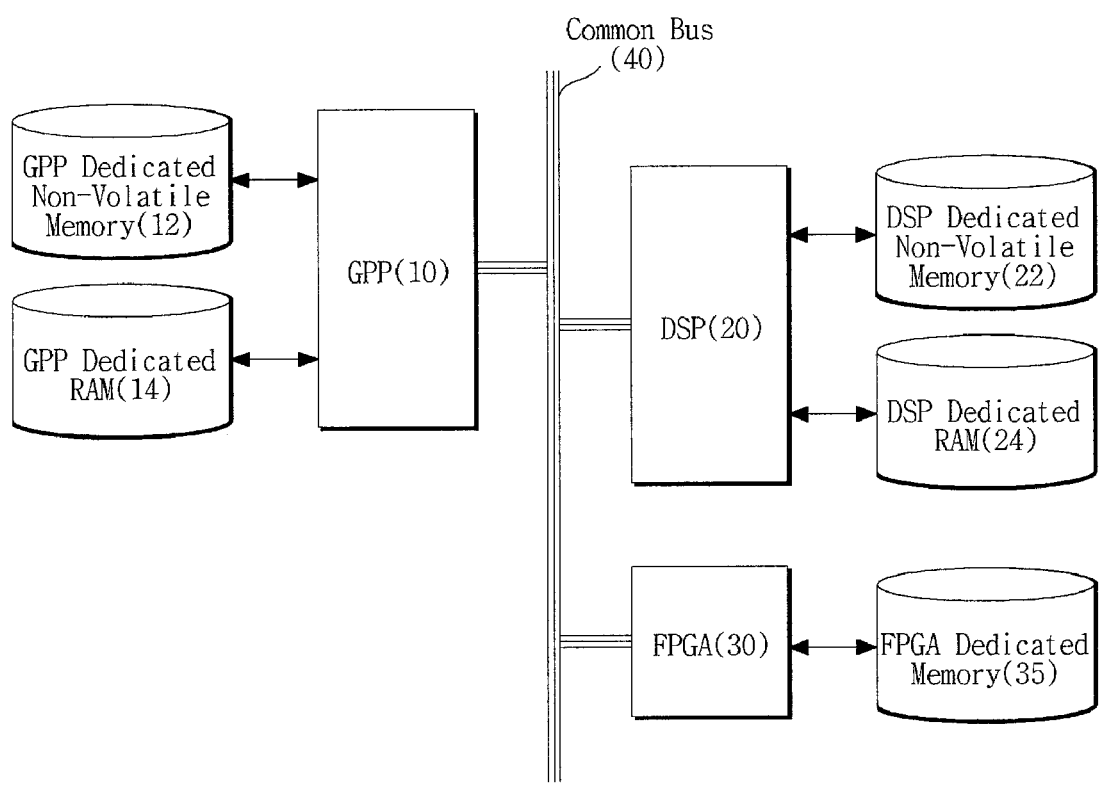
FIG. 1 is a diagram illustrating an example of an exemplary software reconfiguring apparatus.

FIG. 1 is a diagram illustrating an example of an exemplary software reconfiguring apparatus. The software reconfiguring apparatus includes a plurality of reconfigurable elements and a control unit. The control unit may be implemented as a reconfigurable element, or as shown in FIG. 1, a general purpose microprocessor (GPP) may be used as the control unit.

As shown in FIG. 1, the software reconfiguring apparatus includes reconfigurable elements such as a GPP 10, a digital signal processor (DSP) 20, and a filter programmable gate array (FPGA) 30.

The reconfigurable elements are connected to one another via a common bus 40, and may perform data communication therebetween. The common bus 40 consists of an address bus and a data bus, and all reconfigurable elements can share the common bus 40 under the control of the GPP 10.

The GPP functions as a master to control the use of the common bus 40. Also, the GPP includes storage components such as a GPP dedicated non-volatile memory 12 and a GPP dedicated RAM 14. The GPP dedicated non-volatile memory 12 stores program files to be executed in the GPP 10 and program files to be installed in the digital signal processor 20 and the field programmable gate array 30. The GPP dedicated RAM 14 is a space for GPP program execution.

The digital signal processor 20 includes a DSP dedicated non-volatile memory 22 and a DSP dedicated RAM 24. The DSP dedicated non-volatile memory 22 stores program files to be executed in the DSP 20. The DSP dedicated RAM 24 is a space for DSP program execution.

The field programmable gate array (FPGA) 30 is a semiconductor device that contains logic components and reconfigurable interconnects. Programmable logic components can be configured to perform complex combinational functions, or simple logic gates such as AND, OR, XOR, and NOT. The FPGA 30 includes a FPGA dedicated non-volatile memory 35. The FPGA dedicated non-volatile memory 35 stores an FPGA circuit diagram image.

In one example, the GPP 10 allocates programs by copying program files stored in the GPP dedicated non-volatile memory 12 to a storage space of corresponding ones of the reconfigurable elements.

The allocation of programs in the DSP 20 involves the copying of DSP program files stored in the GPP dedicated non-volatile memory 12 to the DSP dedicated non-volatile memory 22. Furthermore, the placement of programs related to the FPGA involves the copying of FPGA program files stored in the GPP dedicated non-volatile memory 12 to the FPGA dedicated non-volatile memory 35. As described above, the GPP 10 is a reconfigurable element, but since the GPP program files are initially stored in the GPP dedicated non-volatile memory 12, the placement of programs related to the GPP 10 is not necessary.

A program placement time $T_p$ refers to time required for placing programs in an element. Thus, the program placement time $T_p$ varies with the size of the program and characteristics of the element.

Program installation refers to loading and installing the program, which has been copied to the non-volatile memory, in a RAM area of each element. For example, in the GPP and the DSP, each including a RAM, the program installation includes process or task generation and execution environment setting, program data initialization and resource allocation, e.g., socket connection ( ) or shared-memory allocation.

Program installation in the GPP 10 includes operations of loading a GPP program stored in the GPP dedicated non-volatile memory 12 into the dedicated RAM 14 area and running the loaded GPP program.

Program installation in the DSP 20 includes operations of loading a DSP program stored in the DSP dedicated non-volatile memory 22 into the DSP dedicated RAM 24 area and running the loaded DSP program.

Program installation in the FPGA 30 includes an operation of configuring a digital circuit by fusing an FPGA execution image stored in the FPGA dedicated non-volatile memory 35 to the FPGA 30.

A program installation time $T_i$ refers to time required for installing a program of a given element. The program installation time $T_i$ varies with the size of the program and characteristics of the element.

In this description, program installation only includes installation of a program which is then put in an operation suspended state, not a stage where a programmed function is practically executed. Upon receipt of a program start command, execution of a function of the program starts. For example, it is assumed that high speed downlink packet access (HSDPA) medium access control (MAC) layer software is installed. Because the operation of the MAC layer software is suspended after installation, a message received from a physical layer or a higher layer is not processed, nor does the MAC software voluntarily send a message to the physical layer or the higher layer. In the same manner, a physical layer of the FPGA does not receive or send a message to the outside, and the running of a function remains suspended.

Program start refers to the initiation of an operation of the software function that remains suspended after installation. The programs in the GPP 10 and the DSP 20 are started by the initiating of a call process procedure or of a process of an internal or external message. The program in the FPGA 30 is started by the initiating of the process of an internally or externally input digital signal in a fused digital circuit. A program start with respect to a MAC program includes an initiation of call process procedure in association with a physical layer or a higher layer. A program start in the physical layer includes an initiation of call process procedure such as acquisition of base station synchronization. That is, only when the program start procedure commences, call process such as a wireless network connection and connection setting of an SDR terminal are initiated, and once the program start procedure is successfully completed, a user can use a service.

A program startup time $T_s$ refers to time required for initiating a program of a given element. The program startup time varies with characteristics of the element.

Figure 2:
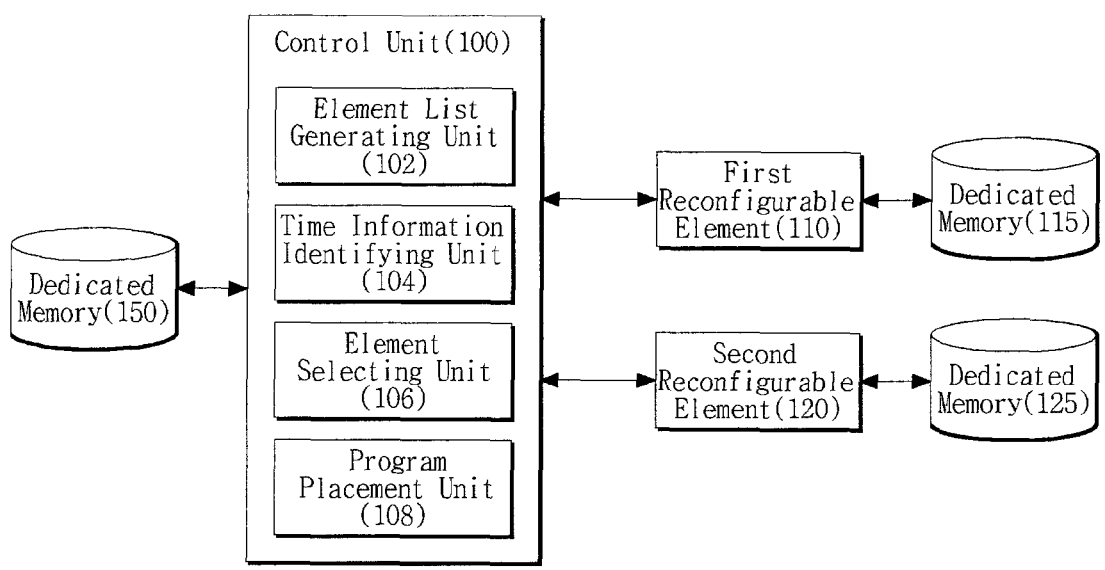
FIG. 2 is a block diagram illustrating an exemplary software reconfiguring apparatus.

FIG. 2 is a block diagram illustrating an exemplary software reconfiguring apparatus. As described above, the control unit 100 may be implemented as a GPP. In addition, a first reconfigurable element 110 and a second reconfigurable element 120 may be implemented as a digital signal processor (DSP) and a field programmable gate array (FPGA), respectively. However, these elements are not limited to the described above, and examples of such elements include obvious modifications.

Furthermore, the control unit 100, the first reconfigurable element 110 and the second reconfigurable element 120 include their own storage spaces, i.e., the storage unit 150, and dedicated memories 115 and 125, respectively. In detail, the control unit 100 includes an element list generating unit 102, a time information identifying unit 104, an element selecting unit 106, and a program placement unit 108.

The element list generating unit 102 generates a list of reconfigurable elements. In one example, the element list generating unit 102 may obtain information on the reconfigurable elements from program installation configuration files.

The time information identifying unit 104 detects installation time and stating time of each reconfigurable element included in the element list. In one example, the program placement time varies with the amount of data to be copied for program placement and a kind of the reconfigurable element.

That is, the program placement time of the first reconfigurable element 110 is time required for copying program files from a non-volatile memory, i.e., the storage unit 150 dedicated to the control unit 100, to the memory 115 dedicated to the first reconfigurable element 110. Also, the program placement time of the second reconfigurable element 120 is time required for copying program files from the storage unit 150 dedicated to the control unit 100, to the memory 125 dedicated to the second reconfigurable element 120.

As described above, the program placement time in the control unit 100 is zero since the program is already stored in the dedicated non-volatile memory. In one example, the time information identifying unit 104 may obtain information on program installation time and startup time from the program installation configuration file.

The element selecting unit 106 selects an element in which a program is placed, based on the information on the program installation time and startup time with respect to each reconfigurable element. The element selecting unit 106 selects a reconfigurable element with the largest sum of the installation time and startup time obtained by the time information identifying unit 104 as the element in which a program is to be placed.

The program placement unit 108 places the program in the reconfigurable element selected by the element selecting unit 106. As described above, the placement of a program involves the copying of a program file stored in a storage unit 150 of the control unit 100 to a dedicated memory of the selected reconfigurable element. The program placement unit 108 controls a common bus to transfer the corresponding program file to the selected reconfigurable element.

The placement of a program in each of the first reconfigurable element 110 and the second reconfigurable element 120 is performed through the common bus. The common bus is exclusively used by only one element at a time. Therefore, the placement of a program to be executed through the common bus cannot be carried out simultaneously for more than one reconfigurable element.

In a software defined radio (SDR) terminal device to which the exemplary software reconfiguring apparatus is employed, a service startup time is required for a reconfigurable element to initiate a wireless communication service. The total service startup time is $T_p+T_i+T_s$. Here, $T_p$ represents program placement time, $T_i$ represents program installation time, and $T_s$ represents program startup time. The sequential program placement is available only in one reconfigurable element, but installation and startup of programs can be performed in parallel by several reconfigurable elements. Based on these facts, a method of minimizing the service startup time with respect to the entire reconfigurable elements is provided. That is, a program is installed first in a reconfigurable element which has the largest sum of the program installation time and the program startup time, so that the placement of programs in other reconfigurable elements can be performed while the installation and startup of the program is carried out in the reconfigurable element which takes the longest time to install and setup. Accordingly, program reconfiguration on the entire reconfigurable elements can be completed within the shortest possible time.

Figure 3:
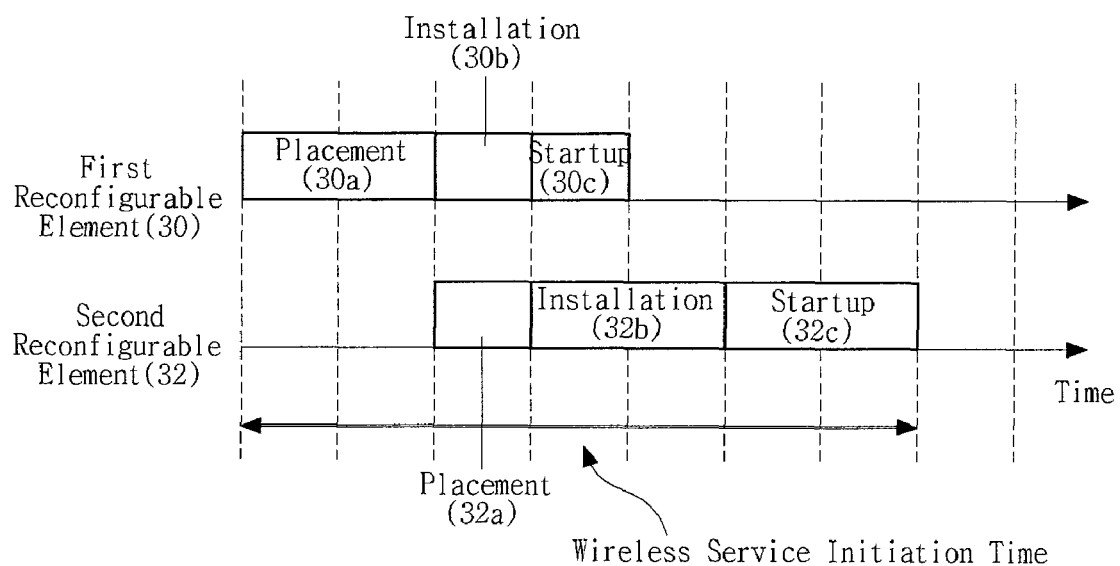
FIGS. 3 and 4 illustrate time required initiating a wireless service.
Figure 4:
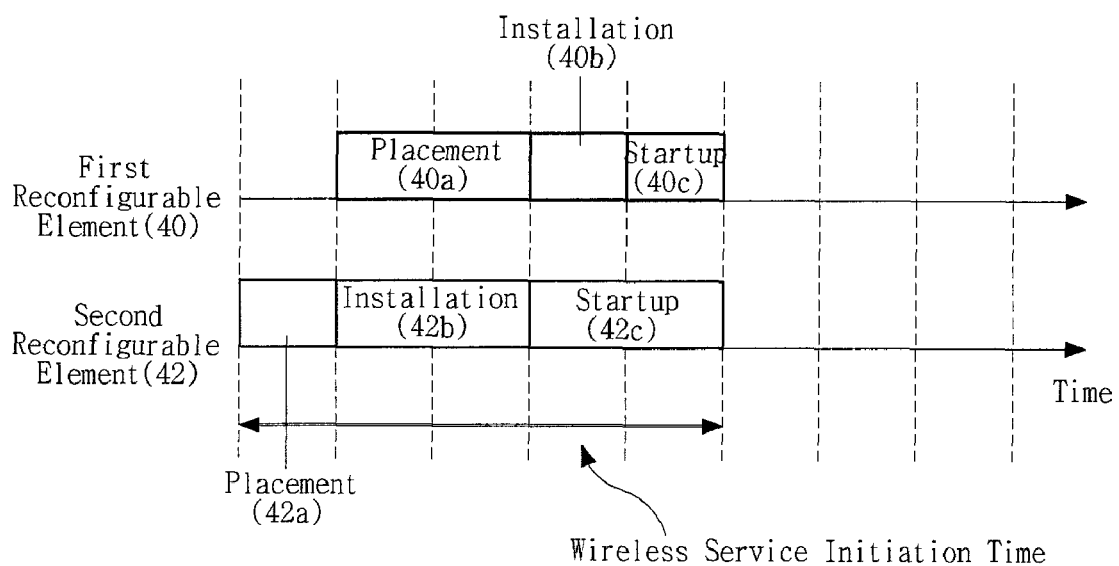

FIGS. 3 and 4 are time diagrams illustrating time required for initiating a wireless service. FIG. 3 illustrates time required for initiating a wireless service without the exemplary software reconfiguring apparatus.

It is assumed that a first reconfigurable element 30 has a placement time 30a of 2 seconds, an installation time 30b of 1 second and a startup time 30c of 1 second and a second reconfigurable element 32 has a placement time 32a of 1 second, an installation time 32b of 2 seconds and a startup time 32c of 2 seconds.

For the first reconfigurable element 30, it takes four seconds to initiate the service, and for the second reconfigurable element 32, it takes five seconds.

If program placement starts with the first reconfigurable element 30 having a short total initiation time, the total wireless service initiation time is 7 seconds, as shown in FIG. 3. As described above, since the common bus is used only by one element in the course of the program placement, simultaneous copying of the program to more than one element cannot be performed. However, since the installation and startup of programs can be performed simultaneously in parallel in each element, the installation and startup may be carried out in both the first and second reconfigurable elements 30 and 32 at the same time.

FIG. 4 illustrates time required for initiating a wireless service by the exemplary software reconfiguring apparatus.

First, the control unit which controls the software reconfiguration initializes an element list such that the list can contain a first reconfigurable element 40 and a second reconfigurable element 42. In one example, the sum of the initiation time and the startup time, $(T_i+T_s)$ of the first reconfigurable element 40 is 2 seconds and $(T_i+T_s)$ of the second reconfigurable element 42 is 4 seconds. Thus, the second reconfigurable element 42 which has the longest $(T_i+T_s)$ among elements of the element list is selected for the program placement to be performed thereon, and then the program placement accordingly begins. Once the program placement is complete on the second reconfigurable element 42, installation 42b and startup 42c of the program is started under the control of the control unit, and the second reconfigurable element 42 is deleted from the element list. Subsequently, an element which has the next longest $(T_i+T_s)$ is selected from the element list for the program placement to be performed next. In FIG. 4, the first reconfigurable element 40 is controlled to start program placement 40a, program installation 40b and program startup 40c after the second reconfigurable element 42 has been deleted from the element list. While the program placement 40a, the program installation 40b and the program startup 40c are sequentially performed on the first reconfigurable element 40, the program installation 42b and the program startup 42c on the second reconfigurable element 42 may be carried out in parallel. Hence, at the time when the program startup 40c is complete on the first reconfigurable element 40, the program startup 42c on the second reconfigurable element 42 may also be complete. Accordingly, the entire wireless service initiation time is 5 seconds, and this includes a reduction of about 2 seconds or 30 percent, compared to the wireless service initiation time shown in FIG. 3.

Figure 5:
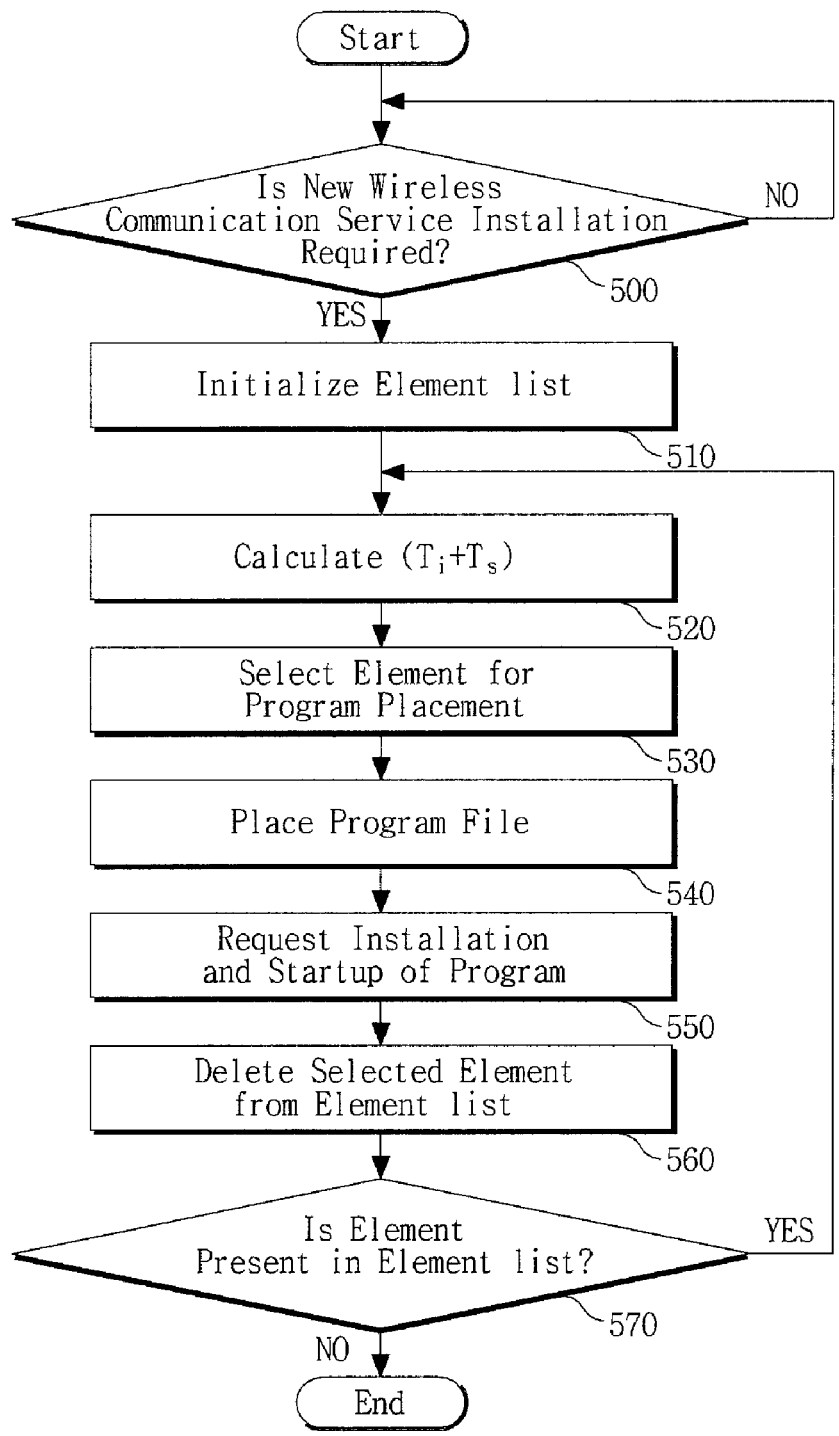
FIG. 5 is a flowchart illustrating an exemplary software reconfiguring method.

FIG. 5 is a flowchart illustrating an exemplary software reconfiguring method. First, where a new wireless communication service installation is needed (operation 500), a list of reconfigurable elements requiring placement and installation of a program is initialized (operation 510). The element list may be obtained from a program installation configuration file. The sum of installation time and startup time, i.e., $(T_i+T_s)$ is calculated with respect to each reconfigurable element included in the element list (operation 520). Information on installation time and startup time may also be obtained from the program installation configuration file with respect to each reconfigurable element.

Subsequently, a reconfigurable element having the largest $(T_i+T_s)$ is selected as an element in which a program is placed (operation 530). The program placement involves copying of program files stored in a non-volatile memory associated with the control unit to a non-volatile memory associated with the selected reconfigurable element. At this time, the remaining reconfigurable elements cannot use the common bus.

Then, when the placement of the program files is complete, a request of installation and startup of the program on the selected reconfigurable element is issued (operation 550). At this time, the installation and startup of the program can be performed in all reconfigurable elements in parallel without interrupting one another.

The selected reconfigurable element is deleted from the element list (operation 570). It is determined whether the element list still includes other reconfigurable elements (operation 570), and if there is no remaining information, the placement and installation of the program of the corresponding reconfigurable elements is completed. Alternatively, if the element list still includes other reconfigurable elements, selecting of a reconfigurable element having the largest ($T_i$+ $T_s$) as a reconfigurable element to which the program is to be placed is repeatedly performed.

As described above, an SDR mobile communication terminal can reduce installation time of a new wireless communication service. Thus, convenience can be provided to a user.

In addition, the time required for switching operation mode to a different wireless communication network can be reduced, and as such seamless service continuity can be provided.

The software reconfiguring method described above can be implemented as a computer program. Also, the method may be recorded, stored, or fixed in one or more computer-readable media that includes program instructions to be implemented by a computer to cause a processor to execute or perform the program instructions. Examples of computer-readable media include magnetic media and optical media.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of reconfiguring software at a software defined radio (SDR) terminal including one or more reconfigurable elements, the method comprising:
   indentifying program installation time and program startup time with respect to the respective reconfigurable elements;
   selecting a reconfigurable element from the one or more reconfigurable elements based on the program installation time and the program startup time; and
   placing a program on the selected reconfigurable element.

2. The method of claim 1, wherein in the selecting of one reconfigurable element, a reconfigurable element having the largest sum of the program installation time and the program startup time is selected.

3. The method of claim 1, further comprising:
   prior to the selecting of one reconfigurable element, generating an element list including information of the respective reconfigurable elements upon receipt of a request for initiating a new wireless communication service; and
   after the selecting is performed, deleting the selected reconfigurable element from the element list.

4. The method of claim 3, after the deleting of the selected reconfigurable element, further comprising:
   determining whether or not the element list still includes other reconfigurable elements,
   wherein when it is determined that other reconfigurable elements are included in the element list, a reconfigurable element is selected from the other reconfigurable elements.

5. The method of claim 4, wherein when it is determined that no other reconfigurable elements remain on the element list, the placing of the program is finished.

6. The method of claim 1, wherein the placing of the program involves the copying of a corresponding program to a storage space associated with the selected reconfigurable element.

7. The method of claim 1, after placing of the program, further comprising requesting installation and startup of the program placed in the selected reconfigurable element.

8. The method of claim 1, wherein information about the program installation time and the program startup time is obtained from program installation configuration information.

9. The method of claim 3, wherein information of reconfigurable elements is obtained from program installation configuration information.

10. A software reconfiguring apparatus comprising:
    one or more reconfigurable elements, the programming of each of which being reconfigurable; and
    a control unit to select a configurable element from the reconfigurable elements based on program installation time and program startup time and to place the program on the selected reconfigurable element.

11. The software reconfiguring apparatus of claim 10, wherein the control unit selects a reconfigurable element having the largest sum of the program installation time and the program startup time.

12. The software reconfiguring apparatus of claim 10, further comprising:
    an information storage unit to store information about the program and information about the one or more reconfigurable elements,
    wherein the control unit identifies the program installation time and the program startup time with respect to the respective reconfigurable elements based on the information stored in the information storage unit.

13. The software reconfiguring apparatus of claim 12, wherein the control unit generates an element list of the reconfigurable elements based on the information stored in the information storing unit, selects one of the reconfigurable elements from the element list and deletes the selected reconfigurable element from the element list.

14. The software reconfiguring apparatus of claim 10, further comprising:
    a common bus to provide a connection channel for data communications between the control unit and each of the reconfigurable elements,
    wherein the control unit controls the common bus.

15. The software reconfiguring apparatus of claim 10, further comprising:
    a plurality of memories dedicated to the respective reconfigurable elements,
    wherein the control unit places the program on the selected reconfigurable element by copying the program information stored in the information storage unit to the memory dedicated to the selected reconfigurable element.

16. The software reconfiguring apparatus of claim 10, wherein the control unit requests the reconfigurable element in which the program is completely placed to install and start up the placed program.

17. The software reconfiguring apparatus of claim 10, wherein the control unit is a reconfigurable element.

* * * * *